(12) United States Patent
Pomar Pedredo et al.

(10) Patent No.: US 12,320,884 B1
(45) Date of Patent: Jun. 3, 2025

(54) SELF-CALIBRATION SYSTEM AND PROCEDURE FOR AUTONOMOUS LOOP AND GROUND IMPEDANCE MEASURING DEVICES

(71) Applicant: Aplicaciones Tecnologicas, S.A., Paterna (ES)

(72) Inventors: Verónica Pomar Pedredo, Paterna (ES); David Ruiz Muñoz, Paterna (ES)

(73) Assignee: APLICACIONES TECNOLOGICAS, S.A., Valencia (ES)

(*) Notice: Subject to any disclaimer, the term of this patent is extended or adjusted under 35 U.S.C. 154(b) by 0 days.

(21) Appl. No.: 18/018,333

(22) PCT Filed: Jul. 26, 2021

(86) PCT No.: PCT/US2021/070563
§ 371 (c)(1),
(2) Date: Jan. 27, 2023

(87) PCT Pub. No.: WO2022/023609
PCT Pub. Date: Feb. 3, 2022

(30) Foreign Application Priority Data

Jul. 27, 2020 (ES) .................................. P202030777

(51) Int. Cl.
*H02H 3/16* (2006.01)
*G01R 27/16* (2006.01)
*G01R 35/00* (2006.01)

(52) U.S. Cl.
CPC .......... *G01R 35/005* (2013.01); *G01R 27/16* (2013.01)

(58) Field of Classification Search
CPC .............................. G01R 27/16; G01R 35/005
See application file for complete search history.

(56) References Cited

U.S. PATENT DOCUMENTS

2016/0111866 A1    4/2016   Angelides

FOREIGN PATENT DOCUMENTS

| EP | 2249169 A1 | 11/2010 |
| EP | 3351946 A1 | 7/2018 |
| ES | 2131005 A1 | 7/1997 |
| GB | 2268811 A  | 1/1994 |

OTHER PUBLICATIONS

International Preliminary Report on Patentability, PCT/ES/2021/070563, 11 pages, Oct. 28, 2022.

*Primary Examiner* — Alesa Allgood
(74) *Attorney, Agent, or Firm* — Danielson Legal LLC

(57) ABSTRACT

Autonomous self-calibration procedure for autonomous loop impedance measuring devices, with a system like the previous one, which comprises an initial stage (8) for obtaining a normalized calibration curve (8.1) of the measuring device and introduction of the normalized values (8.2) in the memory, and a self-calibration stage (9) that includes the phases for obtaining the range (10) of the loop resistance (Rb) of the measuring device, and calculation (14) of the loop impedance values (15).

14 Claims, 4 Drawing Sheets

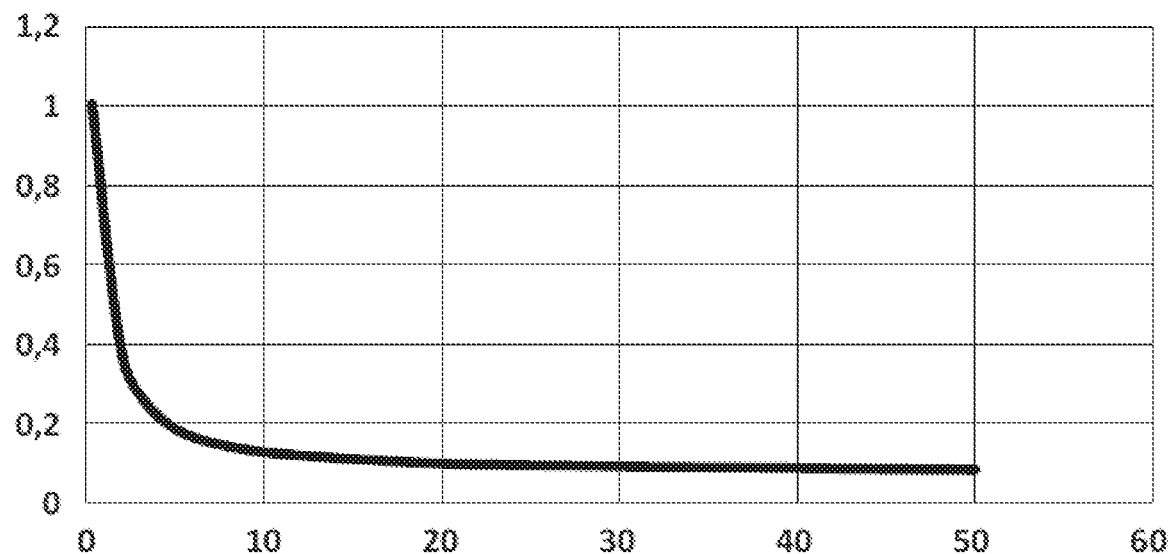
Fig. 4.1
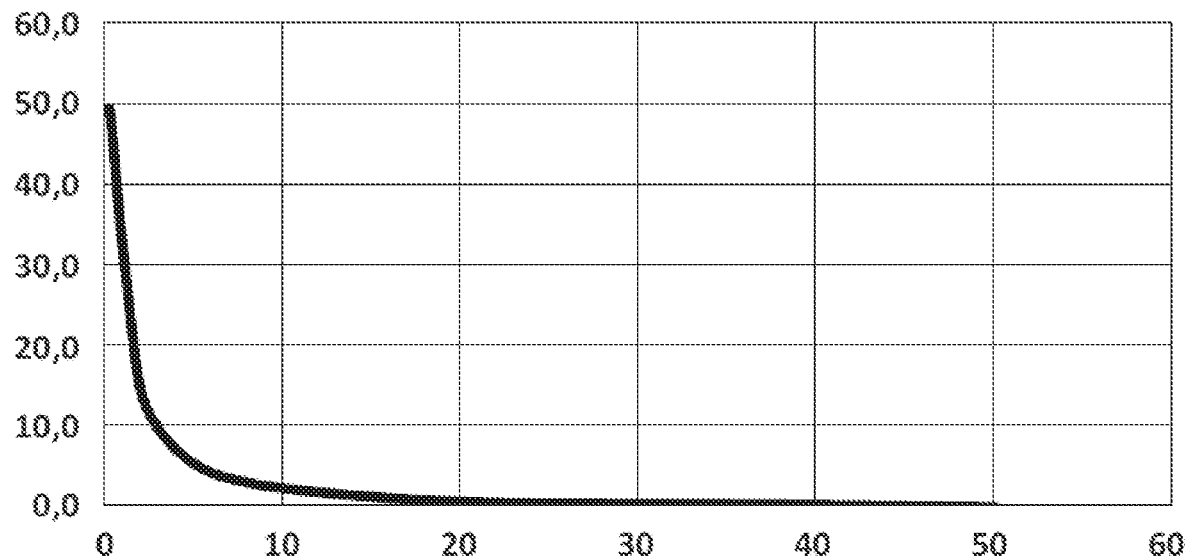
Fig. 4.2

SELF-CALIBRATION SYSTEM AND PROCEDURE FOR AUTONOMOUS LOOP AND GROUND IMPEDANCE MEASURING DEVICES

CROSS REFERENCE TO RELATED APPLICATIONS

This application is the national phase of International (PCT) Patent Application No. PCT/ES2021/070563, filed internationally on Jul. 26, 2021, which claims priority to application no. P202030777, filed nationally on Jul. 27, 2020 the entire disclosures of each of which are hereby incorporated by reference in their entirety.

TECHNICAL FIELD OF THE INVENTION

The present invention corresponds to the technical field of loop impedance measuring devices that have a loop impedance sensor with a grounding conductor and wherein the calibration curve of the measuring device has at least two different ranges of values and, specifically to a self-calibration system and procedure for these measuring devices.

BACKGROUND OF THE INVENTION

To verify a grounding system, the checking and measurement of loop impedance is mainly applied to TN and IT distribution systems, in which the protection systems are based on fuses or circuit breakers.

When a certain leakage current leaves the ground rod, a significant part of that current returns to the installation through the transformer secondary rod, and the line conductor, where the fault occurred. Therefore, there is a short-circuit current flowing through the fault loop and adding to the load current in the line.

The measurement of the loop impedance has a stability problem due to the large number of variables that influence measurement uncertainty (temperature, eddy currents, geometric micro-variations of the sensor, length and geometry of the cables, etc. . . . ). That is why it is difficult to have a sensor of this type that has a completely stable response in any condition and environment.

In addition, when it is an unattended appliance, that is, it does not require continuous operation by the installer, it implies that, under normal conditions of use, a conductor of the grounding system is being monitored by the sensing element, which causes difficulties for the comparison calibration process since there is always a parallel loop whose value is unknown.

Loop impedance sensors are on the market and it is easy to find compact handheld measuring devices that perform this loop impedance measurement function. On these, it is easy to carry out maintenance, verification and calibration of the device, since they are always accessible and loops whose impedance value is known can be connected.

The problem arises with unattended devices, since they are not able to carry out this task of measuring the loop impedance autonomously, since the sensors used has homogeneity problems due to natural causes, such as temperature, humidity, etc. . . . , and to human causes, such as, for example, the position and tightening carried out during the installation of the sensor. These variables have an influence on the result of the measurement, so it is necessary to correct this deviation. However, an initial correction is not enough, as this deviation can change from one day to the next due to the natural causes described above.

It is not known in the state of the art the existence of any impedance measuring device that has any self-calibration mechanism or a system that allows the device to self-calibrate, so that, prior to each measurement to be carried out by said device, whose periodicity is programmable, self-calibration is carried out.

DESCRIPTION OF THE INVENTION

The self-calibration system for autonomous loop impedance measuring devices presented here deals with measuring devices that have a loop impedance sensor for a grounding conductor and where the calibration curve of the measuring device has at least two different ranges of values.

This self-calibration system comprises a processing device connected to the impedance sensor and formed by a containment housing, inside which it comprises a microprocessor having a storage memory, an auxiliary loop, communication means with a data receiving device and power supply means.

For its part, the auxiliary loop is connected in parallel to at least two precision resistors by means of a switch respectively for each of them, wherein each resistor has a certain value, these values being different from each other and such that there is at least one resistance value within each range of the calibration curve.

The system has a ground impedance calculation algorithm that allows the application of this system to the monitoring of loops that are closed by the physical ground. This allows a measurement of the grounding resistance to be obtained.

In this specification, a self-calibration procedure is proposed for autonomous loop impedance measuring devices, for adjusting the current injection frequency by means of a self-calibration system as defined above.

This procedure comprises an initial stage of obtaining a normalized calibration curve of the measuring device and introduction of the normalized values of said calibration curve in the memory of the system, and a self-calibration stage that has a first phase of obtaining the range in which the resistance of the loop of the measuring device is included.

This first phase is carried out by means of the sequential activation of the switches corresponding to the at least one resistance of each range of the normalized calibration curve, so that the connection of each switch configures an equivalent circuit between the loop of the measuring device and the auxiliary loop of the corresponding resistance associated with said switch.

Finally, a second phase for the calculation of the value of the loop impedance is carried out.

By means of the self-calibration system for autonomous loop impedance measuring devices and the self-calibration procedure by means of said system proposed herein, a significant improvement of the state of the art is obtained.

This is so because a procedure is achieved that, automatically before each measurement, makes an adjustment of the current injection frequency, which allows obtaining the exact value of resistance to monitor, using the dependence with the characteristic frequency of current transformers.

This system is also completely autonomous and allows the installer to monitor the installation in a continuous and unattended way. In addition, it makes it possible to guarantee the reproducibility of the measurement and reduce the dependence on the variables that influence the dispersion of the measurement (temperature, vibrations or shocks, length and arrangement of the connecting cable between the sensor element and the processing part).

Continuous communication avoids the need to establish periodic verification reviews, since up-to-date information on the status of the monitored loop is available at all times, thus reducing preventive and corrective maintenance work.

On the other hand, this system has a specific filtering mechanism that eliminates with a high rejection factor the noise caused by eddy currents, typical of the grounding systems of electrical installations, such as transformation centers (CT's) or substations (SE's).

The system also incorporates a method of identifying current pulses in the associated conductor, characteristic of partial discharges (DP's), typical of systems that are subjected to electrical stress, such as line insulators, insulated cables for transmission of electrical energy, transformers, etc. . . . . This characteristic makes it possible to identify situations of aging, degradation, fault, etc. . . . which is an advantage for the preventive and corrective maintenance of the assets of the electric power transmission and distribution networks.

Therefore, a self-calibration system and a self-calibration procedure are achieved through it, that is very efficient, reliable and programmable, that acts continuously and completely autonomously.

BRIEF DESCRIPTION OF THE DRAWINGS

In order to help a better understanding of the characteristics of the invention, according to a preferred example of its practical embodiment, a series of drawings is provided as an integral part of said description, wherein, with an illustrative and non-limiting nature, the following has been shown:

FIGS. 4.1 and 4.2.—Show a normalized calibration curve and a characteristic calibration curve respectively, of the measuring device, used in the autonomous self-calibration procedure for autonomous loop impedance measuring devices, according to a preferred embodiment of the invention.

DETAILED DESCRIPTION OF A PREFERRED EMBODIMENT OF THE INVENTION

In view of the figures provided, it can be seen how in a preferred embodiment of the invention, the self-calibration system proposed herein is for autonomous loop impedance measuring devices that have a loop impedance sensor (2) for a grounding conductor (3) and wherein the calibration curve of the measuring device has at least two different ranges of values.

In this embodiment, said calibration curve is shown in FIG. 4.2 and specifically runs through three ranges of values.

Figure 1:
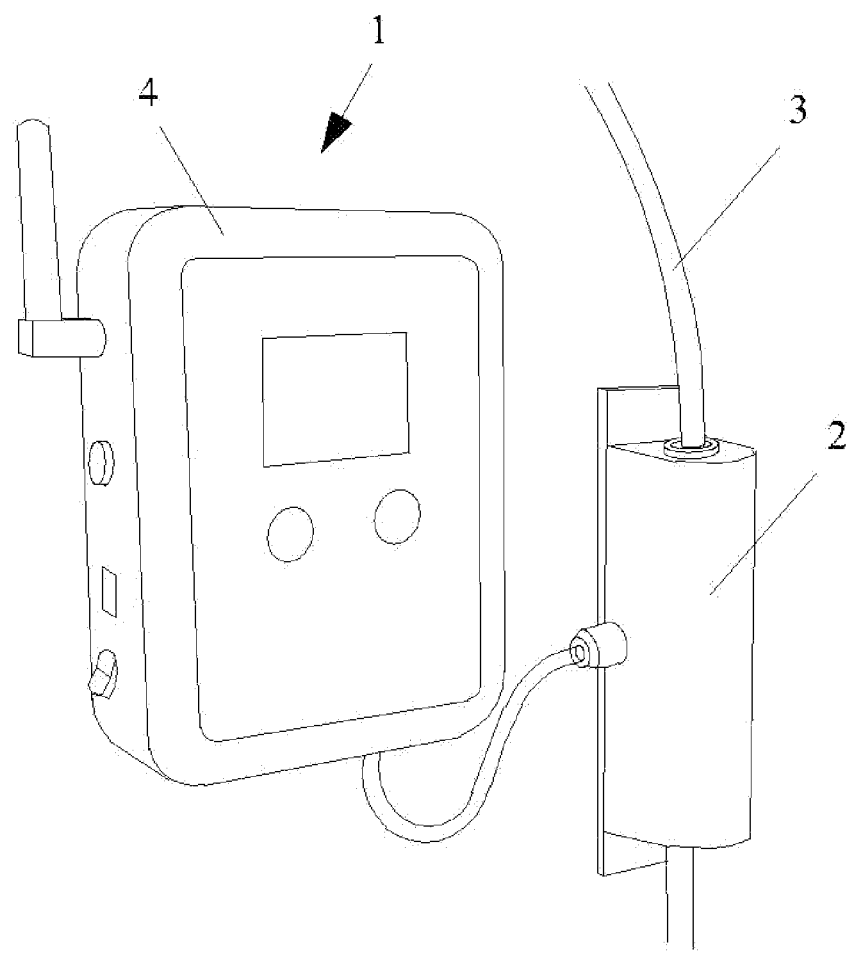
FIG. 1.—Shows a perspective view of the processing device of the self-calibration system for autonomous loop impedance measuring devices, according to a preferred embodiment of the invention.

As can be seen in FIG. 1, this system comprises a processing device (1) connected to the impedance sensor (2), wherein said processing device (1) is formed by a containment housing (4).

Inside the housing (4) the processing device (1) comprises a microprocessor having a storage memory, an auxiliary loop (5) connected in parallel to at least two precision resistors (6) by means of a switch (7) respectively for each one of them, means for communication with a data receiving device, and power supply means.

Each precision resistor (6) has a certain value, these values being different from each other and such that there is at least one resistance value within each range of the calibration curve.

In this preferred embodiment of the invention, in which, as indicated, the calibration curve, shown in FIG. 4.2, has three different ranges of values, the system comprises a number of precision resistors (6) and with values such that, the values of at least two precision resistors (6) are within each of the loop impedance ranges.

Figure 2:
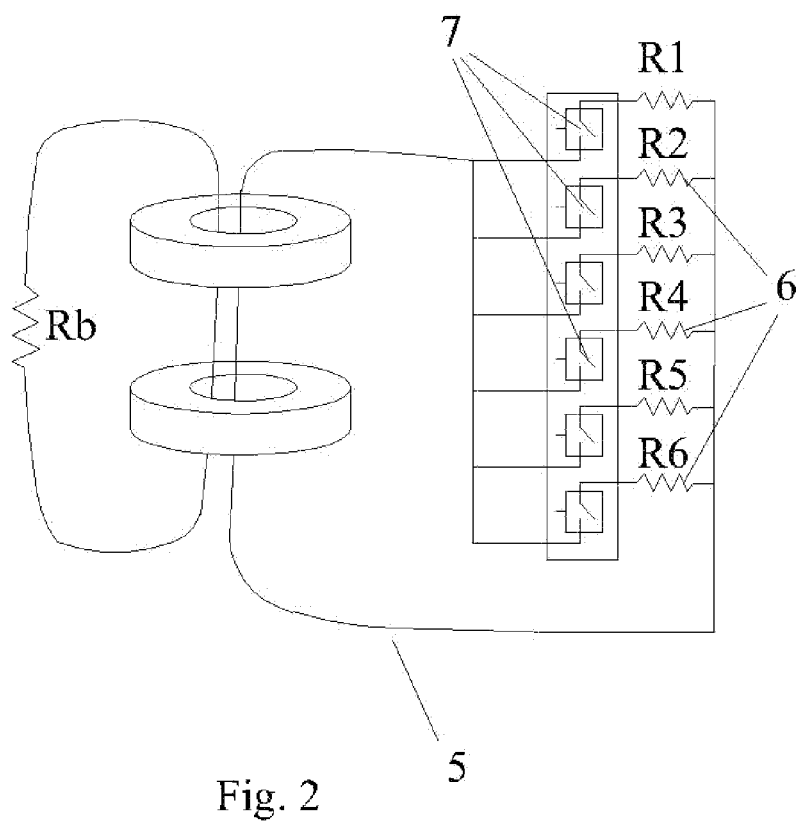
FIG. 2.—Shows a schematic view of the auxiliary loop of the self-calibration system for autonomous loop impedance measuring devices, according to a preferred embodiment of the invention.

Thus, in this specific case and as shown in FIG. 2, the processing device (1) consists of six precision resistors (6), so that the value of a first and second resistors (R1, R2) is comprised in a first range, the value of a third and fourth resistors (R3, R4) is comprised in a second range and the value of a fifth and sixth resistors (R5, R6) is comprised in a third range.

In this preferred embodiment of the invention, the communication means consist of wireless communication, specifically GSM communication. However, in other embodiments they can be formed by other types of wireless communication or by a wired communication, for example via Ethernet.

On the other hand, in this preferred embodiment of the invention, the power supply means are formed by a battery connected to a solar power system. In other embodiments, they can be formed by a connection to the electrical network or a combination of both.

This specification also proposes an autonomous self-calibration procedure for autonomous loop impedance measuring devices, for adjusting the current injection frequency by means of a self-calibration system as previously defined.

This procedure comprises an initial stage (8) for obtaining a normalized calibration curve (8.1) of the measuring device, which can be seen in FIG. 4.1, and introducing the normalized values (8.2) of said calibration curve in the memory of the processing device. From this curve and by means of two variables K1 and K2 (gain and offset) the corresponding characteristic curve can be obtained, which is shown in FIG. 4.2.

This characteristic curve responds to the formula: (K1× normalized curve)+K2

The procedure in turn has a self-calibration stage (9) made up of a series of phases.

Thus, said self-calibration stage (9) comprises a first phase for obtaining the range (10) in which the resistance of the loop (Rb) of the apparatus is included by means of sequential activation of the corresponding switches (7) of the two precision resistors (6) of each range of the normalized calibration curve, so that the connection of each switch (7) configures an equivalent circuit between the loop of the measuring device and the auxiliary loop (5) corresponding to the precision resistor (6) associated with said switch (7).

In this way, each of the six resistors (R1 to R6) is sequentially connected until the range in which the loop resistance (Rb) of the measuring device is included is obtained.

In this preferred embodiment of the invention, obtaining the range (10) in which the loop resistance (Rb) of the measuring device is included comprises measuring (11) the value of said loop resistance (Rb) of the apparatus of the equivalent circuit corresponding to at least one precision resistor (6) and the comparison (12) of the value obtained with that of said precision resistor (6), wherein said measurement (11) and comparison (12) are carried out after a the activation of the switch (7) thereof.

Figure 3:
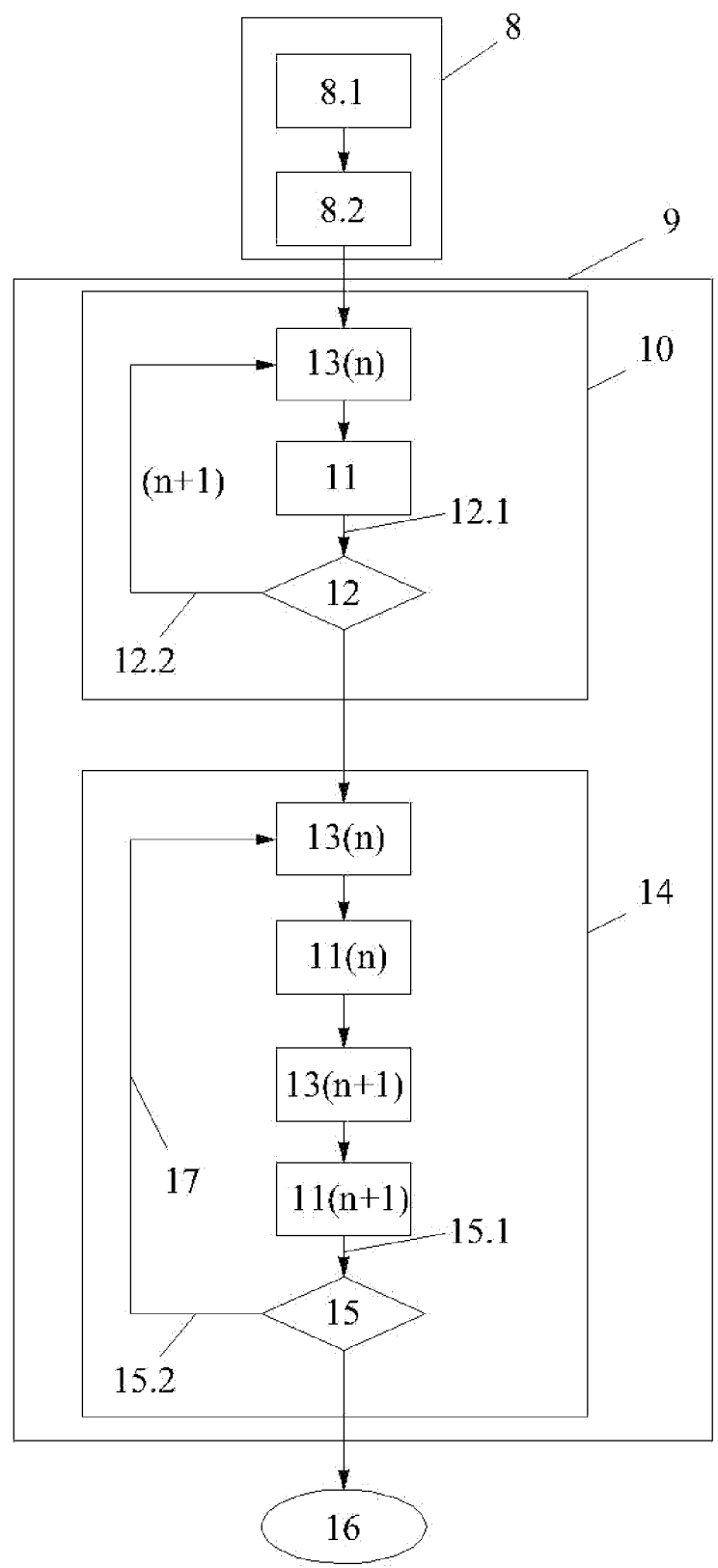
FIG. 3.—Shows a block diagram of the autonomous self-calibration procedure for autonomous loop impedance measuring devices, according to a preferred embodiment of the invention.

As shown in FIG. 3, in which this procedure has been represented for the generic case of a resistor n, the phase for obtaining the range would be carried out as follows:

Firstly and in the generic case of FIG. 3, a first resistor (13 (*n*)) of a first range is connected, by activating a first switch. In the proposed embodiment with six resistors, resistor R1 is connected.

Between the measurement loop and the auxiliary loop (5) a circuit with two resistors in parallel is generated and the equivalent circuit is one with a resistor whose value is the value of the parallel one of the two connected resistors, according to the following formula:

$$R(\text{parallel}) = \frac{1}{\frac{1}{R1} + \frac{1}{Rb}}$$

After the connection of a first resistor (13 (*n*)), the measurement (11) of the resistance of the equivalent parallel circuit (Rparallel) is carried out. In this preferred embodiment of the invention, with six precision resistors, the resistor R1 of the first range is connected and with its value and the value of the resistor of the equivalent parallel circuit (Rparallel), we solve from the previous formula and a resistive value of the measurement loop resistance (Rb) is obtained, being unknown.

Using a determined algorithm, the system analyzes whether the resistive value obtained for the loop resistance (Rb) of the device belongs to the range of the first connected resistor (R1). For this purpose, the comparison (12) of the obtained value is carried out and, if said resistive value, that is, the value of the measurement loop resistance (Rb), corresponding to said precision resistor (6), which in this mode of embodiment is the first resistor (R1), is greater than ¼ and less than ¾ of its value, that is, if 0.25 R1<Rb<0.75R1 (which for the generic case is 0.25 Rn<Rb<0.75Rn).

If said comparison (12) is positive (12.1), the phase for obtaining the range ends, the range of the loop resistance (Rb) of the measuring device being the same as that of said precision resistor (6), in this case the first resistor (R1).

In that case, knowing the range of the loop resistance (Rb) of the measuring device, a second calculation phase (14) of the loop impedance values (15) takes place.

If, on the other hand, the value of the loop resistance (Rb) obtained by means of the first precision resistor, turns out to be less than ¼ or greater than ¾ of its value, the comparison (12) is negative (12.2) and in this case, the sequential activation of the switches continues, in this case the switch corresponding to the precision resistor (n+1), consecutive with the previous one (in this proposed embodiment, the switch of the second resistor (R2) would be activated).

Again, the calculation of the value of the loop resistance (Rb) is performed considering the equivalent circuit corresponding to this new resistor (n+1) consecutive with respect to the previous one and the steps (11) for measuring the resistance of the equivalent parallel circuit (Rparallel) are repeated, obtaining the loop resistance (Rb) of the measuring device and checking whether said loop resistance (Rb), corresponding to a precision resistor (6), is greater than ¼ and less than ¾ of the value thereof.

Once the range of the loop resistance (Rb) of the measuring device has been obtained, for the second phase consisting of calculating the loop impedance values (15), this is performed for each of the precision resistors (6) of that range. Therefore, in this preferred embodiment of the invention, if it has been obtained that the loop resistance (Rb) of the measuring device is in the same range as the first resistor (R1), the calculation is performed for the two resistors (R1 and R2) of said determined range.

In this preferred embodiment of the invention, if the comparison between the loop impedance values (15) obtained for the same range is less than 1%, the value is correct (15.1) and the measurement (16) of the loop impedance is carried out with the same frequency value of injected current and all the switches (7) open.

Therefore, the next step is the activation (13 (*n*)) of the switch (7) of a first resistor (R1) and the resistance value of the equivalent parallel circuit (Rparallel) is measured (11 (*n*)) for said first resistor (R1 or n in general).

Next, the switch (7) of a consecutive resistor in the same range is activated (13 (n+1)), in this case R2 or (n+1) in general, and (11 (n+1)) the value of the resistance of the equivalent parallel circuit (Rparallel) for said second resistor is measured.

With both values, a comparison is made between the loop impedance values (15) obtained for the same range. If this value is less than 1%, that is, if Rn/R (n+1)<1% is satisfied, the value is correct (15.1) and with the same value of the frequency of the injected current and all the switches (7) open, the measurement (16) of the loop impedance is carried out.

On the contrary, if the comparison of the loop impedance values (15) obtained for the same range results in a value greater than 1%, the value is incorrect (15.2) and the injected current frequency value is modified (17) increasing it by 1% and the calculation (14) of the loop impedance values (15) is performed again.

The described embodiment constitutes only an example of the present invention, therefore, the specific details, terms and phrases used in the present specification are not to be considered as limiting, but are to be understood only as a basis for the claims and as a representative basis that provides an understandable description, as well as sufficient information to the person skilled in the art to apply the present invention.

The invention claimed is:

1. Self-calibration system for autonomous loop impedance measuring devices, said measuring devices having a loop impedance sensor (2) for a grounding conductor (3), wherein the self-calibration system comprises a processing device (1) connected to the impedance sensor (2), wherein said processing device (1) is formed by a containment housing (4) inside which it comprises a microprocessor having a storage memory;

an auxiliary loop (5) including at least two precision resistors (6) arranged in parallel and selectively activated by means of a switch (7) respectively for each of them, said auxiliary loop (5) being arranged in parallel with a loop resistance (Rb) to be measured, wherein each precision resistor (6) has a certain value, these values being different from each other; and power supply means;

characterized in that the self-calibration system further comprises means of communication with a data receiving device;

wherein a normalized calibration curve (8.1) of the measuring device has at least two different ranges of values, and there is at least one resistance value comprised in each range of the calibration curve;

wherein the self-calibration system has a ground impedance calculation algorithm that allows the application of this system for adjusting the current injection frequency and impedance calculation to unattended monitoring of loops that are closed by the physical ground;

and wherein the self-calibration system is configured to implement an initial stage (8) for obtaining the normalized calibration curve (8.1) of the measuring device and introduction of the normalized values (8.2) of said calibration curve in the memory of a processing device, and a self-calibration stage (9) which has the phases of obtaining the range (10) in which the measured loop resistance (Rb) is included by connecting the at least one precision resistor (6) of each range of the normalized calibration curve (8.1) from a sequential activation (13 (*n*)) of the switches (7) corresponding to each precision resistor (6), so that the activation of each switch (7) configures an equivalent circuit between the loop of the measuring device and the auxiliary loop (5) corresponding to the precision resistor (6) associated with said switch (7), and;

calculating (14) the loop impedance values (15) based on the obtained range.

2. Self-calibration system, according to claim 1, characterized in that it comprises a number of precision resistors (6) such that at least two precision resistors (6) have values within the same loop impedance range, for each one of the ranks thereof.

3. Self-calibration system, according to claim 1, characterized in that the means of communication are made up of a wired communication via Ethernet.

4. Self-calibration system, according to claim 1, characterized in that the means of communication are made up of wireless communication.

5. Self-calibration system, according to claim 4, characterized in that 1 wireless communication is formed by a GSM communication.

6. Self-calibration system, according to claim 1, characterized in that the power supply means are formed by a battery connected to a solar power system.

7. Self-calibration system, according to claim 1, characterized in that the power supply means are formed by a connection to the electrical network.

8. Autonomous self-calibration procedure for autonomous loop impedance measuring devices, for adjusting the current injection frequency by means of a self-calibration system as defined in claim 1, characterized in that it comprises an initial stage (8) for obtaining the normalized calibration curve (8.1) of the measuring device and introduction of the normalized values (8.2) of said calibration curve in the memory of a processing device, and a self-calibration stage (9) which has the phases of obtaining the range (10) in which the measured loop resistance (Rb) is included by connecting the at least one precision resistor (6) of each range of the normalized calibration curve (8.1) from a sequential activation (13 (*n*)) of the switches (7) corresponding to each precision resistor (6), so that the activation of each switch (7) configures an equivalent circuit between the loop of the measuring device and the auxiliary loop (5) corresponding to the precision resistor (6) associated with said switch (7), and;

calculating (14) the loop impedance values (15) based on the obtained range.

9. Autonomous self-calibration procedure, according to claim 8, characterized in that obtaining the range (10) in which the loop resistance (Rb) of the measuring device is included comprises a measurement (11) of the value of said loop resistance (Rb) of the equivalent circuit corresponding to at least one precision resistor (6) and a comparison (12) of the value obtained with respect to that of said precision resistor (6), wherein said measurement (11) and comparison (12) are performed simultaneously with the activation of the switch (7) thereof.

10. Autonomous self-calibration procedure, according to claim 9, characterized in that if the value of the loop resistance (Rb) of the measuring device corresponding to a precision resistor (6) is greater than ¼ and less than ¾ of its value, the comparison (12) is positive (12.1) and the phase for obtaining the range (10) ends, the range of the loop resistance (Rb) of the measuring device being the same as that of said precision resistor (6).

11. Autonomous self-calibration procedure, according to claim 9, characterized in that if the value of the loop resistance (Rb) of the measuring device corresponding to a precision resistor (6) is less than ¼ or greater than ¾ of its value, the comparison (12) is negative (12.2) and the calculation of the value of the loop resistance (Rb) of the measuring device of the equivalent circuit corresponding to a precision resistor (6) consecutive with respect to the previous one is carried out.

12. Autonomous self-calibration procedure, according to claim 8, characterized in that if there are at least two precision resistors (6) for each range, the calculation (14) of the loop impedance values (15) is performed for each of the precision resistors (6) of said range.

13. Autonomous self-calibration procedure, according to claim 12, characterized in that if the comparison between the loop impedance values (15) obtained for the same range is less than 1%, the value is correct (15.1) and with the same injected current frequency value and all the switches (7) open, the measurement (16) of the loop impedance is carried out.

14. Autonomous self-calibration procedure, according to claim 12, characterized in that if the comparison of the loop impedance values (15) obtained for the same range is greater than 1%, the value is incorrect (15.2) and the injected current frequency value is modified (17) by increasing it by 1% and the calculation (14) of the loop impedance values (15) is performed again.

* * * * *